United States Patent [19]

Haji et al.

[11] Patent Number: 5,207,369
[45] Date of Patent: May 4, 1993

[54] INNER LEAD BONDING APPARATUS WITH REPLACEABLE TOOL

[75] Inventors: Hiroshi Haji, Kasuga; Kiyoshi Arita, Fukuoka, Japan

[73] Assignee: Matsushita Electric Industrial Co., Ltd., Osaka, Japan

[21] Appl. No.: 795,218

[22] Filed: Nov. 20, 1991

[30] Foreign Application Priority Data

Nov. 29, 1990 [JP] Japan .................................. 2-333918
Feb. 13, 1991 [JP] Japan .................................. 3-19803

[51] Int. Cl.[5] ...................... H01L 21/60; B23K 101/40
[52] U.S. Cl. ..................................... 228/4.5; 228/6.2; 228/49.1
[58] Field of Search ............... 228/1.1, 4.5, 6.2, 180.2, 228/47, 49.1, 110, 904

[56] References Cited

U.S. PATENT DOCUMENTS 3,384,283  5/1968  Mims ..................... 228/110
4,050,618  9/1977  Angelucci et al. ............... 228/180.2
4,893,742  1/1990  Bullock .............................. 228/1.1
5,060,843  10/1991 Yasuzato et al. .................... 228/4.5

FOREIGN PATENT DOCUMENTS 60-243336  11/1985  Japan ..................... 228/4.5
3-12943    1/1991   Japan ..................... 228/4.5

Primary Examiner—Richard K. Seidel
Assistant Examiner—Jeanne M. Elpel
Attorney, Agent, or Firm—Lowe, Price, LeBlanc & Becker

[57] ABSTRACT

A process for manufacturing electronic components known as TAB method comprises a process employing a single apparatus for forming bumps in a chip, a process of inner lead bonding for bonding said bumps to leads of a film carrier, and a process of outer lead bonding for bonding the leads to a circuit board after punching said film carrier. The bumps are formed by plating means or by stud bump means using a capillary tool. In another aspect of the invention there is provided an apparatus by which it is possible to form the bumps and to perform the inner lead bonding in a single apparatus. The capillary tool for forming the inner lead bonding and a pressing tool for the inner lead bonding are replaceably and selectively mounted to be held on a horn. Also, there are provided a pickup head for moving the chip furnished in a chip feeding unit to the chip stage and a moving table for moving the chip stage. The capillary tool is held by the horn, and the bumps are formed in the chip on the chip stage while pulling out a wire from the capillary tool. Next, the pressing tool is manually mounted to be held by the horn in place of the capillary tool, and the leads of the film carrier on the chip stage are bonded to the bumps formed in the chip.

6 Claims, 11 Drawing Sheets

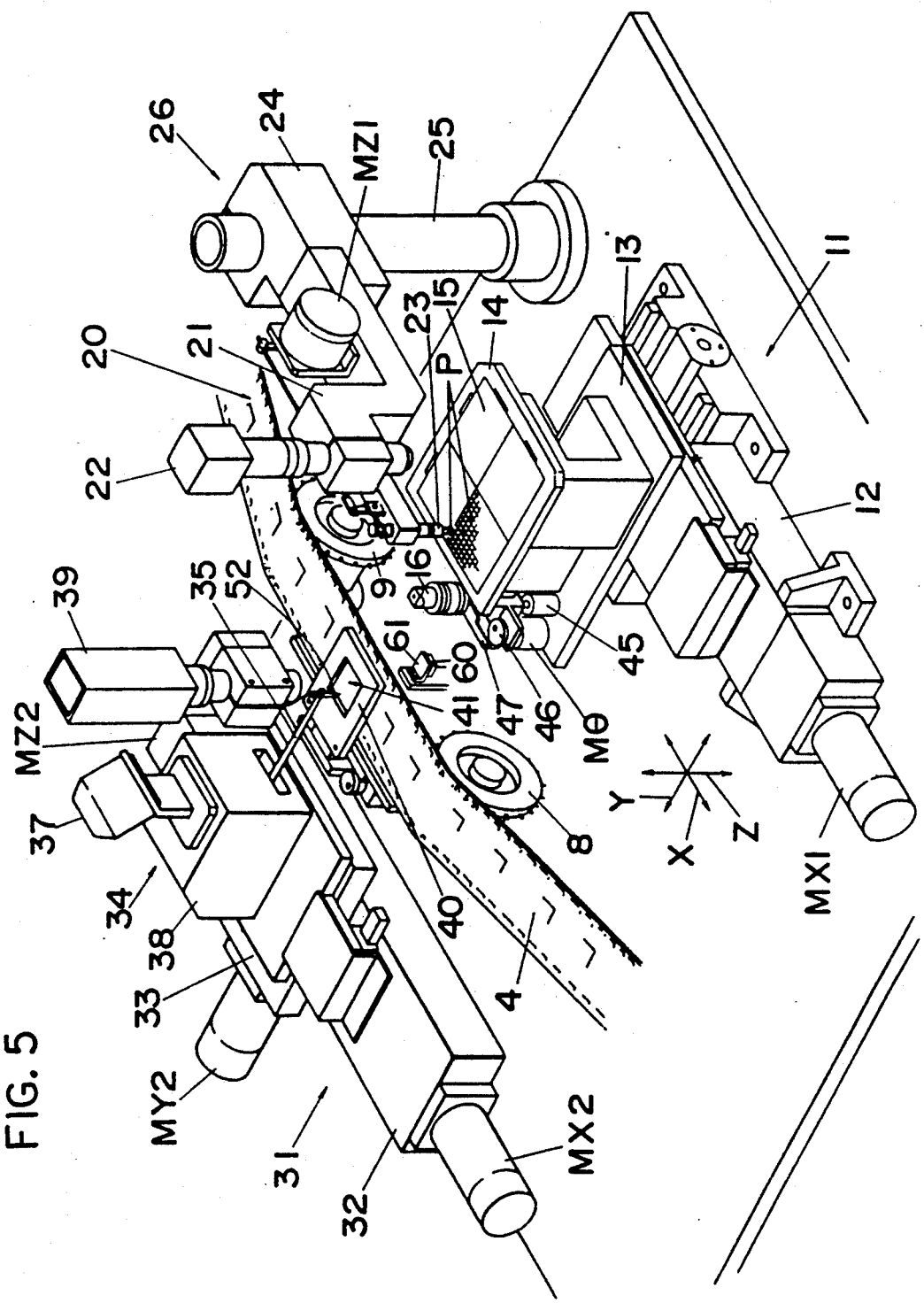

INNER LEAD BONDING APPARATUS WITH REPLACEABLE TOOL

TECHNICAL FIELD

The present invention relates to an inner lead bonding apparatus, or more particularly to an apparatus, by which a working process for forming bumps in a chip and a working process for performing inner lead bonding to connect the bumps to leads of a film carrier can be carried out in the same apparatus.

BACKGROUND OF THE INVENTION

A process for producing electronic components known as TAB method (Tape Automated Bonding Method) comprises a process for forming bumps in a chip, a process of inner lead bonding for connecting the bumps to leads of a film carrier, and a process of outer lead bonding for connecting the leads to a circuit board after the film carrier has been punched. The bumps are formed by plating means or stud bump means using a capillary tool.

The forming of the bumps in the chip and the inner lead bonding have been performed in the past independently by separate apparatuses. That is, the bumps are at first formed on upper surface of the chip by a bump forming apparatus, and the chip provided with the bumps are accommodated in a tray, and the tray is set on an inner bonding apparatus to achieve the inner lead bonding.

However, since the arrangement as described above requires both the bump forming apparatus and the inner lead bonding apparatus, a large-scale production line is needed, and this leads to higher facility cost. Also, much labors are required for maintenance and control of the two apparatuses. Variations and non-uniformity tend to occur in the height of the bumps, which are formed on upper surface of the chip, and it is difficult to bond the leads of the film carrier to the bumps.

SUMMARY OF THE INVENTION

It is a first object of the present invention to provide a producing system, by which the forming of the bumps and the inner lead bonding can be performed in an apparatus.

It is a second object of the present invention to provide an apparatus, by which it is possible to eliminate variations and non-uniformity in the height of the bumps formed on upper surface of the chip.

To attain the above objects, the inner lead bonding apparatus according to the present invention comprises a feeding reel, having a film carrier wound on it, a coiling reel for coiling the film carrier on it, pitch feeding means for pitch-feeding the film carrier, a horn driven by an X-Y table to move toward above the film carrier in X-Y directions, a capillary tool and a pressing tool replaceably held on the horn, wire feeding means for feeding a wire to the capillary tool, a chip feeding unit, a pickup head for mounting chips furnished on the chip feeding unit to a chip stage, and a moving table for moving the chip stage.

Also, a pressing member for pressing the bumps formed on upper surface of the chip is provided along a moving path of the chip stage.

In the arrangement as described above, the bumps are formed in the chips by holding the capillary tool on the horn, and the chip on the chip feeding unit is placed on the chip stage by the pickup head. The chip stage is then moved just under the capillary tool, and the capillary tool is moved in X or Y direction while pulling out a wire from the capillary tool. The chip with the bumps thus formed is returned to the chip feeding unit by the pickup head.

When the bumps are formed in the chip and after the pressing member is pressed on the bumps to adjust and align the heights of the bumps, inner lead bonding is achieved. The inner lead bonding is performed by taking out the capillary tool from the horn and by holding the pressing tool on the horn. The film carrier is set and pitch-feeding is performed.

The bumps of the chip are connected to the leads of the film carrier by mounting the chip of the chip feeding unit on the chip stage by the pickup head and by driving the moving table to move the chip under the film carrier. Then, the inner lead bonding is carried out by pressing the leads on the bumps by the pressing tool while moving the pressing tool in X or Y direction. The inner lead bondings are successively performed while pitch-feeding the film carrier. Upon completion of the inner lead bonding, the film carrier is coiled on the coiling reel.

BRIEF DESCRIPTION OF THE DRAWINGS

FIGS. 5, 6 and 7 are perspective views of the inner lead bondings;

DETAILED DESCRIPTION OF THE PREFERRED EMBODIMENT

Figure 1:
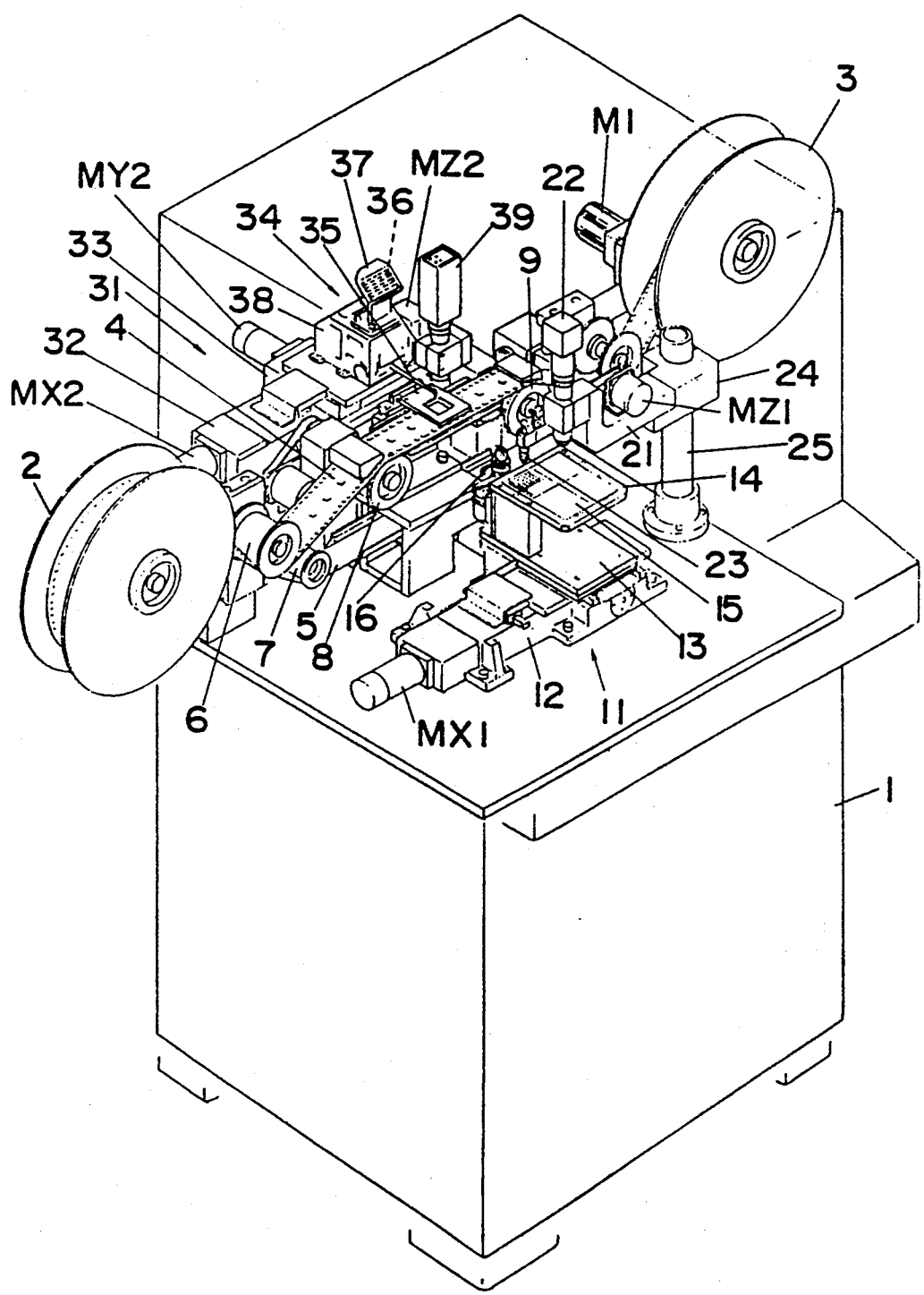
FIG. 1 is a perspective view of an inner lead bonding apparatus.
Figure 2:
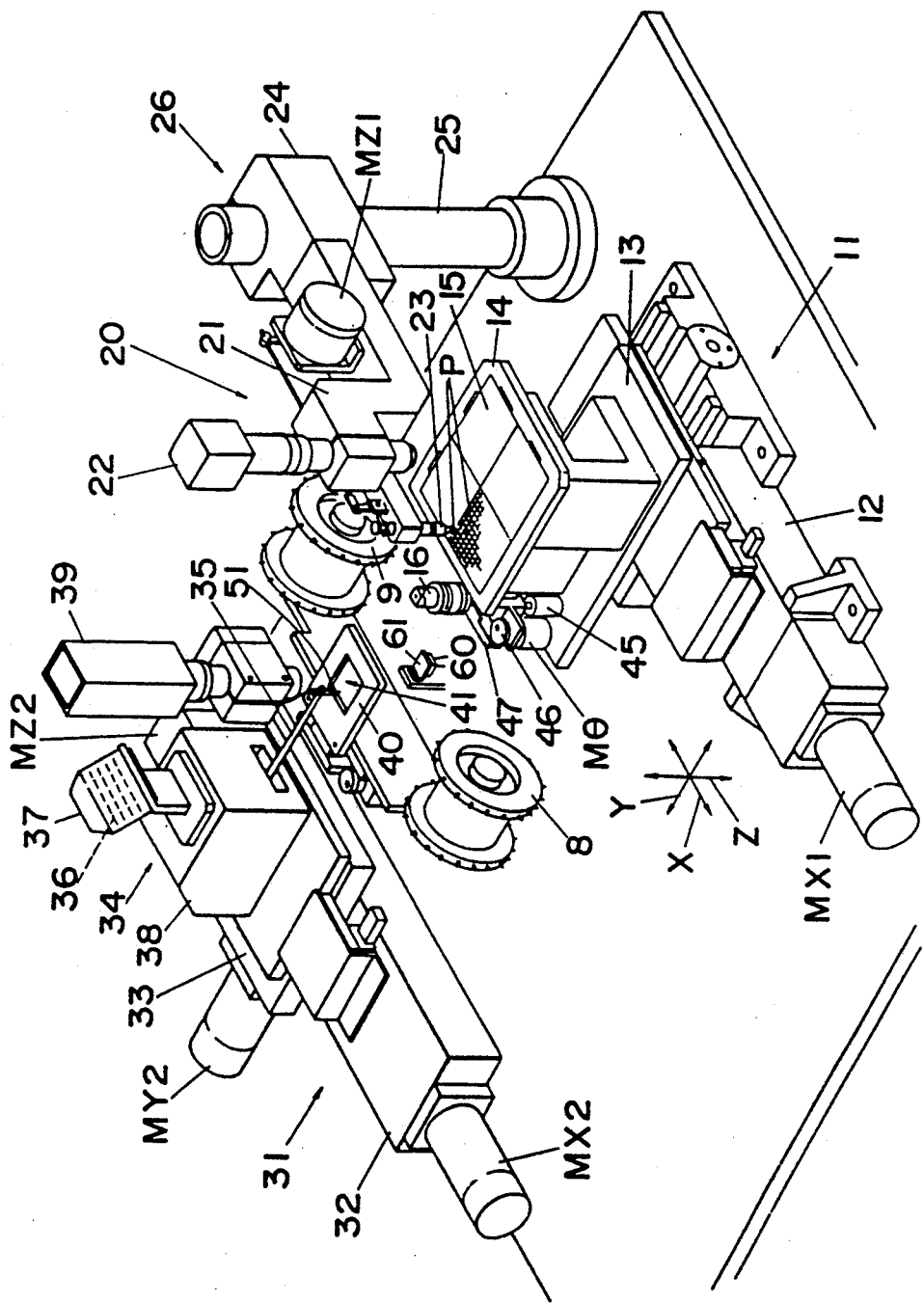
FIG. 2 is a perspective view of the bumps in a process of forming.
Figure 6:
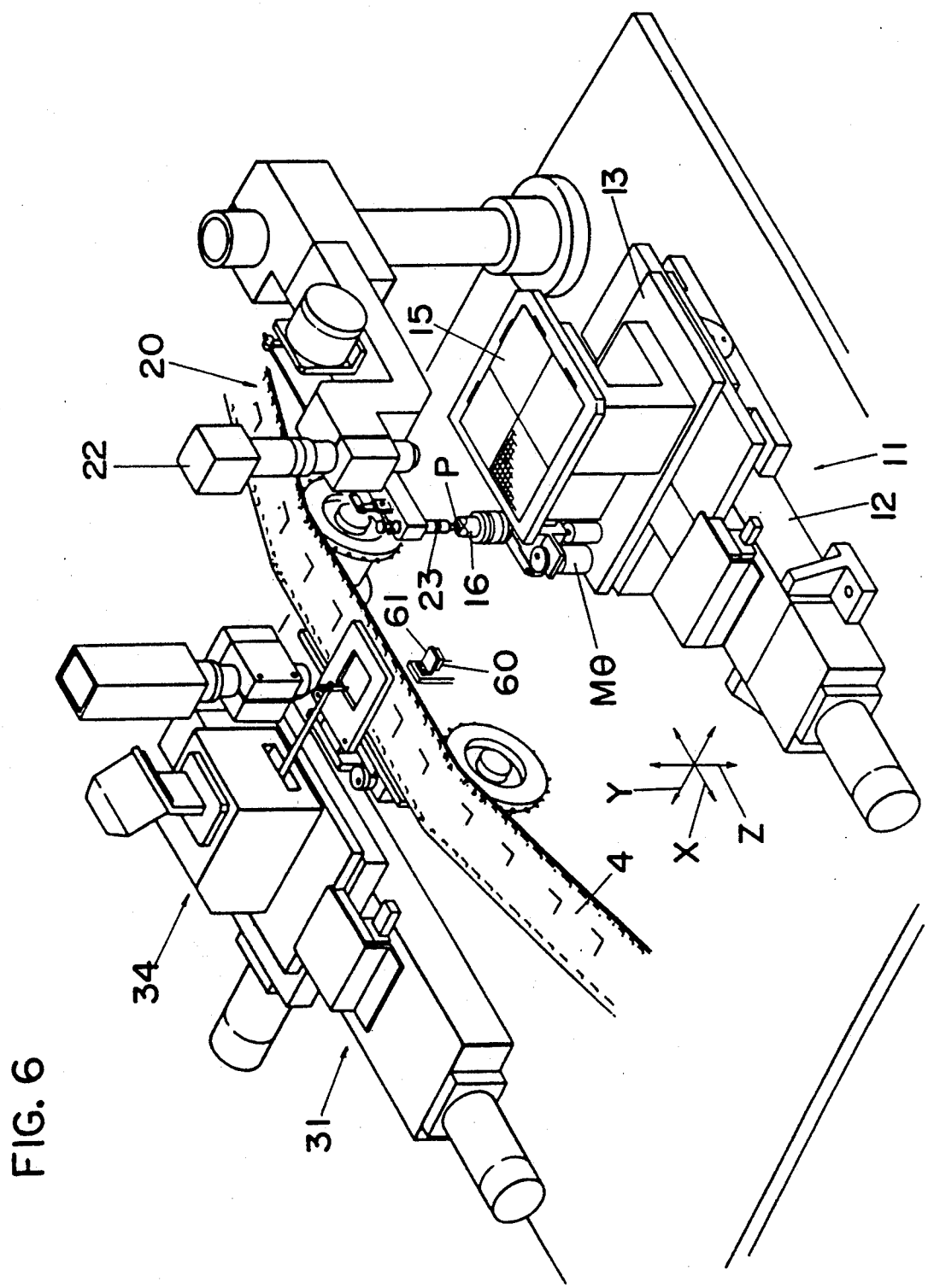
Figure 7:
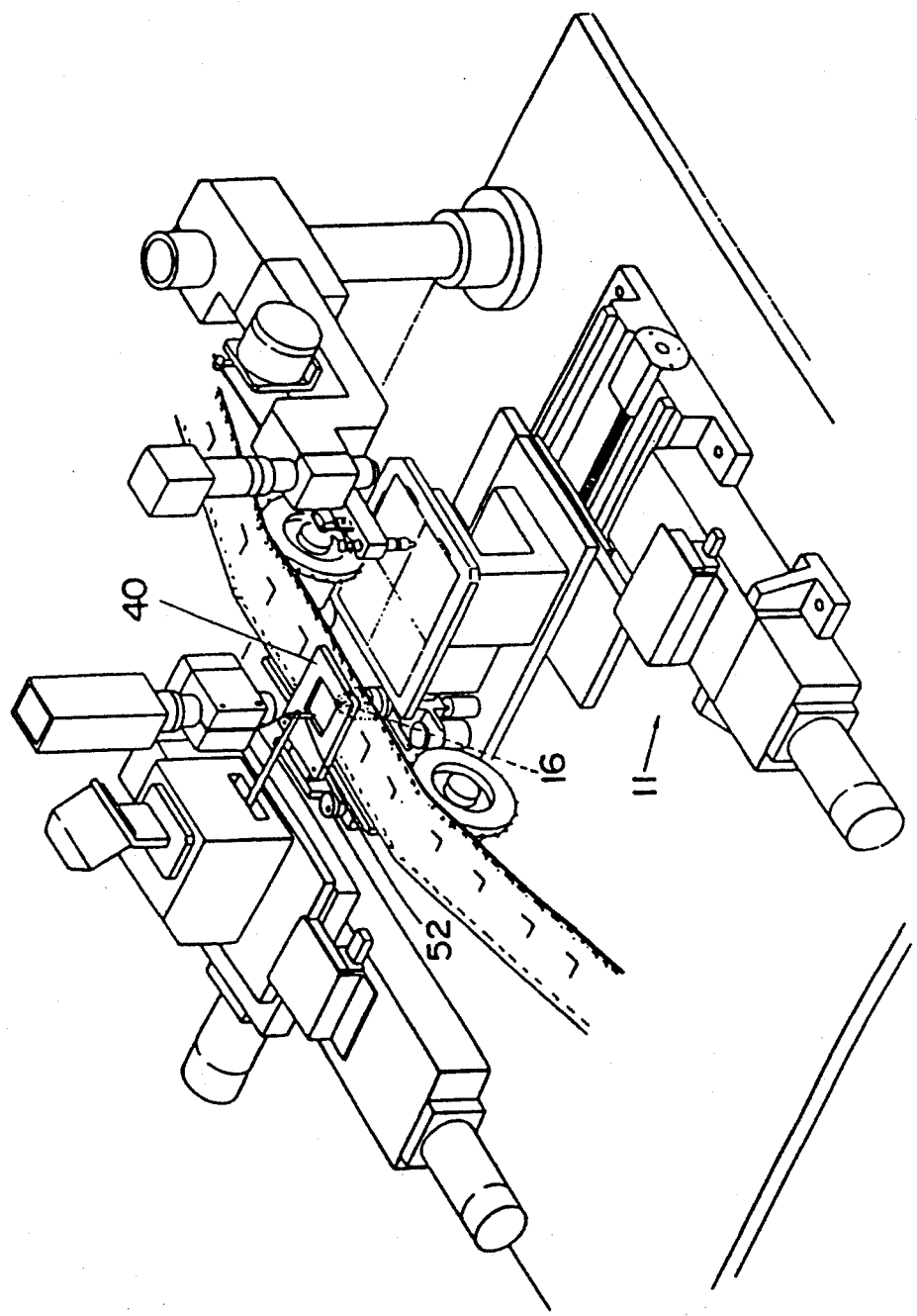

FIG. 1 is an overall and perspective view of an inner lead bonding apparatus. FIG. 2 is a perspective view of an essential part of the apparatus when the bumps are being formed by said inner lead bonding apparatus. FIGS. 5 to 7 are perspective views of essential parts of the system when the inner lead bonding is being carried out by the same apparatus. In FIG. 1, the reference numeral 1 designates a main body box, on which component members described below are installed. The numerals 2 and 3 designate a feeding reel and a coiling reel respectively. On the feeding reel 2, a film carrier 4 and a protective paper tape 5 are coiled.

Between the reels 2 and 3, there are provided guide rollers 6 and 7 are sprockets 8 and 9 serving as pitch-feeding means. The film carrier 4 delivered from the feeding reel 2 is turned around a roller 6, is pitch-fed by the sprockets 8 and 9, and coiled on the coiling reel 3. A protective paper tape 5 is turned around the roller 7, is sent under the film carrier 4, and is coiled on the coiling reel 3 together with the film carrier 4. M1 is a driving motor for the coiling reel 3.

In FIG. 5, the reference numeral 11 designates an X-Y table furnished on the main body box 1, which is composed of an X-table 12, a Y-table 13, an X-direction motor MX1, and a Y-direction motor (not shown). On the Y-table 13, a support 14 is furnished, on which a tray 15 is mounted as a chip feeder.

A chip P is placed on the tray 15. The Y-table 13 has a chip stage 16 on its side and the chip 1 is mounted on it. M♭ is a motor for rotating a cam 46. When the cam 46 is rotated, a lever 47 supporting the chip stage 16 is rotated, and the chip stage 16 is rotated by θ rotation (horizontal rotation). The reference number 45 is a cylinder serving as an elevating means for moving the chip stage 16 up and down.

The numeral 20 is a pickup head which comprises a camera 22 and a pickup nozzle 23 attached on a bracket 21. On a rear part of the bracket 21, a block 24 is provided which is mounted movably on a vertical guide shaft 25.

When motor MZ1 is driven, the pickup head 20 is moved up and down along the guide shaft 25. That is, the block 24, the guide shaft 25 and the motor MZ1 make up a Z table 26, which moves the pickup nozzle 23 up and down.

The X-Y table 11 is driven to move a desired chip P placed on the tray 15 just under the camera 22 for observing the chip P by the camera 22 and for detecting it. Further, the X-Y table 11 is driven to move the chip P just under the pickup nozzle 23, and the motor MZ1 is driven to vertically move the pickup nozzle 23 and to pick up the chip P.

Then, the X-Y table 11 is driven to move the chip stage 16 under the chip adsorbed on the pickup nozzle 23. By driving the motor MZ1 to vertically move the pickup nozzle 23, the chip P is mounted on the chip stage 16 (see FIG. 6). Thus, the X-Y table serves as a moving table for the tray 15 and the chip stage 16.

Figure 10:
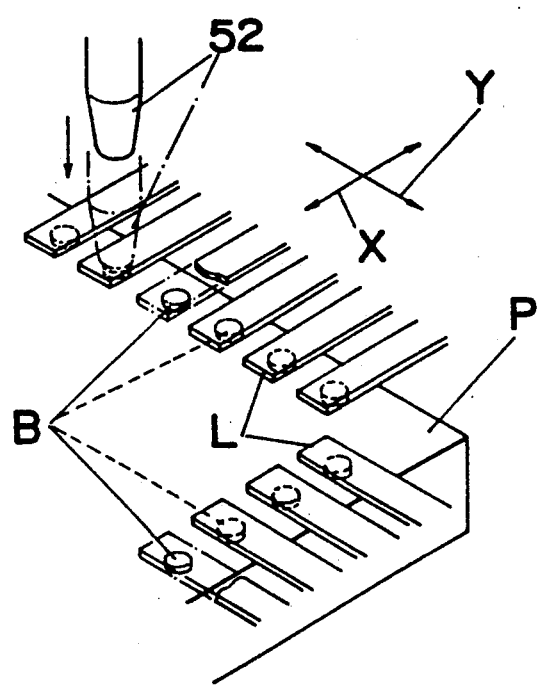
FIG. 10 is a perspective view of an essential part of the apparatus in the process of inner lead bonding.

The X-Y table 11 is driven to move the chip stage 16 under the camera 22 and to detect positional deviation in X, Y or θ directions of the chip P on the chip stage 16. The positional deviation in the X or Y directions is corrected by controlling moving strokes of the X-Y table 11. In addition, the positional deviation thereof in θ direction is corrected by driving the motor Mθ by θ rotation of the chip stage 16. By correcting the positional deviation of the chip P in the X, Y or θ directions, bumps B formed on upper surface of the chip P can be correctly connected to lead wires L of the film carrier 4 as seen in FIG. 10.

In FIG. 1 and 5, the reference numeral 31 designates a second X-Y table which comprises an X-table 32, a Y-table 33, an X-direction motor MX2 and a Y-direction motor MY2. A head unit 34 is disposed on the Y-table 33. The numeral 38 is a main body case, and a rod-shaped horn 35 is arranged on the head unit 34. The horn 35 projects toward above the film carrier 4, and a capillary tool 51 (FIG. 2) and a pressing tool 52 (FIG. 5) are replaceably held on a front end of the horn 35.

In FIG. 2, MX2 is a motor for moving the horn 35 up and down. Within the case 38, there is provided a means for giving ultrasonic vibrations to the horn 35. A spool 37 coiled with a wire 36 is furnished on the head unit 34, and the wire 36 is supplied to the capillary tool 51. By a camera 39, the lead wire of the film carrier 4 and chip P can be observed.

Figures 8A, 8B:
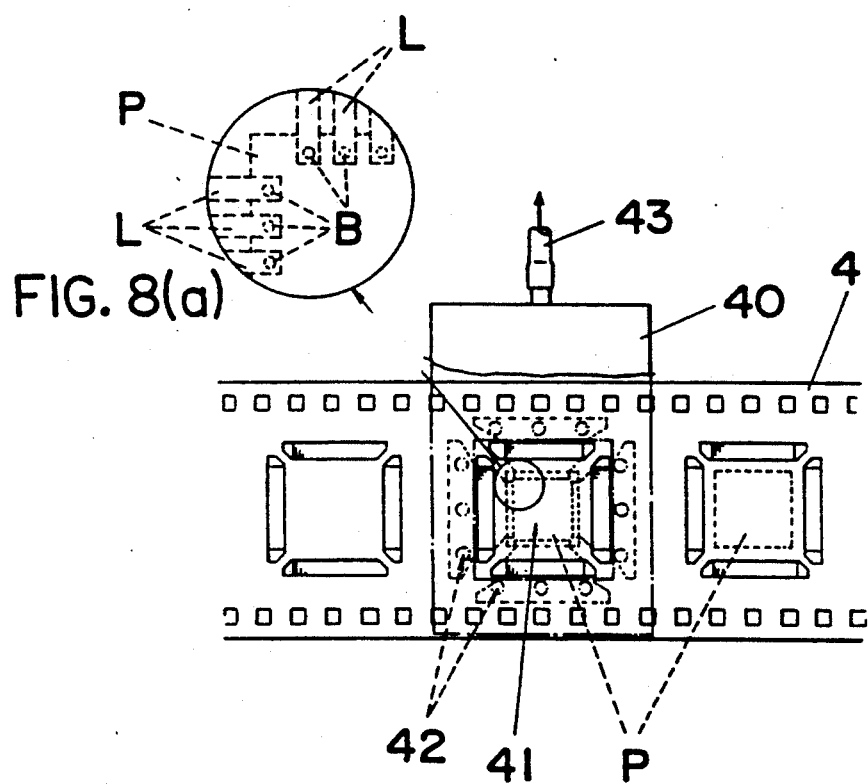
FIGS. 8 and 9 are plan views of adsorption stages.
Figure 9:
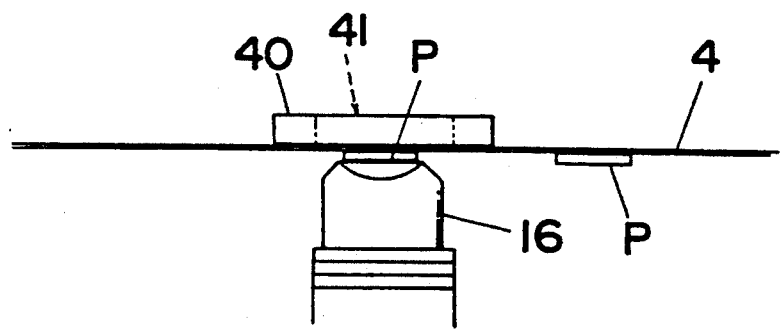

In FIGS. 5, 8 and 9, the reference numeral 40 designates an adsorption plate, on which an opening portion 41 is furnished at its center and adsorption holes 42 are provided on its circumference. The numeral 43 represents an adsorption tube.

Under a condition that the pitch feeding of the film carrier 4 is stopped, the upper surface of the film carrier 4 is adsorbed and fixed to the adsorption hole 42. Further, under this condition, the chip stage 16 with the chip P mounted on it is moved toward under the opening portion 41, and the bumps B on the upper surface of the chip P are connected to the leads L of the film carrier 4. (See also FIG. 10.) The adsorption plate 40 is furnished above the film carrier 4 in the present embodiment, but it may be fixed by adsorbing lower side of the film carrier 4.

Figure 4A:
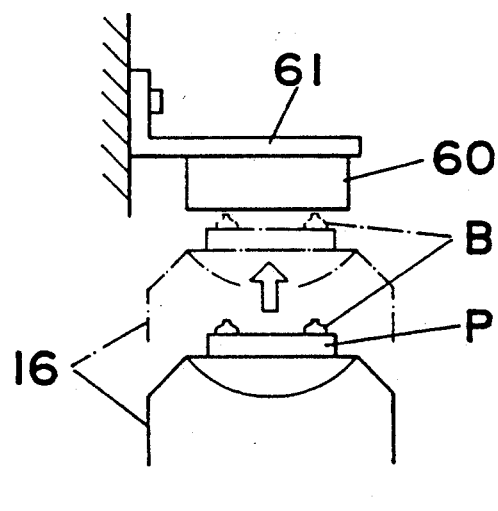
FIG. 4 (a) and (b) are side views of the bumps in a process of pressing.
Figure 4B:
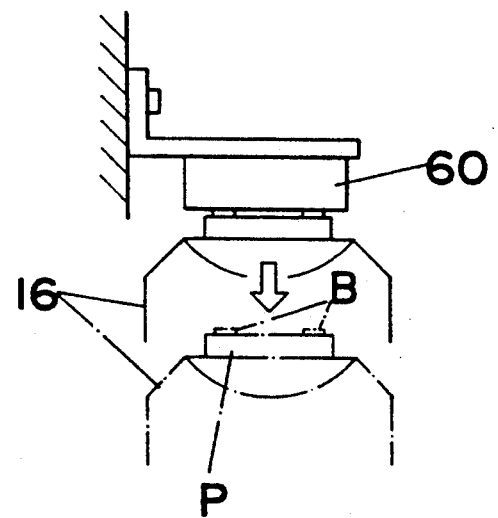

As shown in FIG. 5, a pressing member 60 is provided above a moving path of the chip stage 16. The chip stage 16 moves just under the pressing member 60 as illustrated in FIG. 4 (a), and a cylinder 45 (FIG. 5) is then actuated so that the chip stage 16 is moved upward as shown in FIG. 4 (b). Then, the bumps B are pressed on lower side of the pressing member 60, and the upper surface of the bump B is adjusted to align the height. The numeral 61 is a holder for the pressing member 60. (To simplify the explanation, the pressing member 60 is not given in FIG. 1.)

The present apparatus has the arrangement as described above. Description is now given on the operation of the entire apparatus.

Figures 3A, 3C:
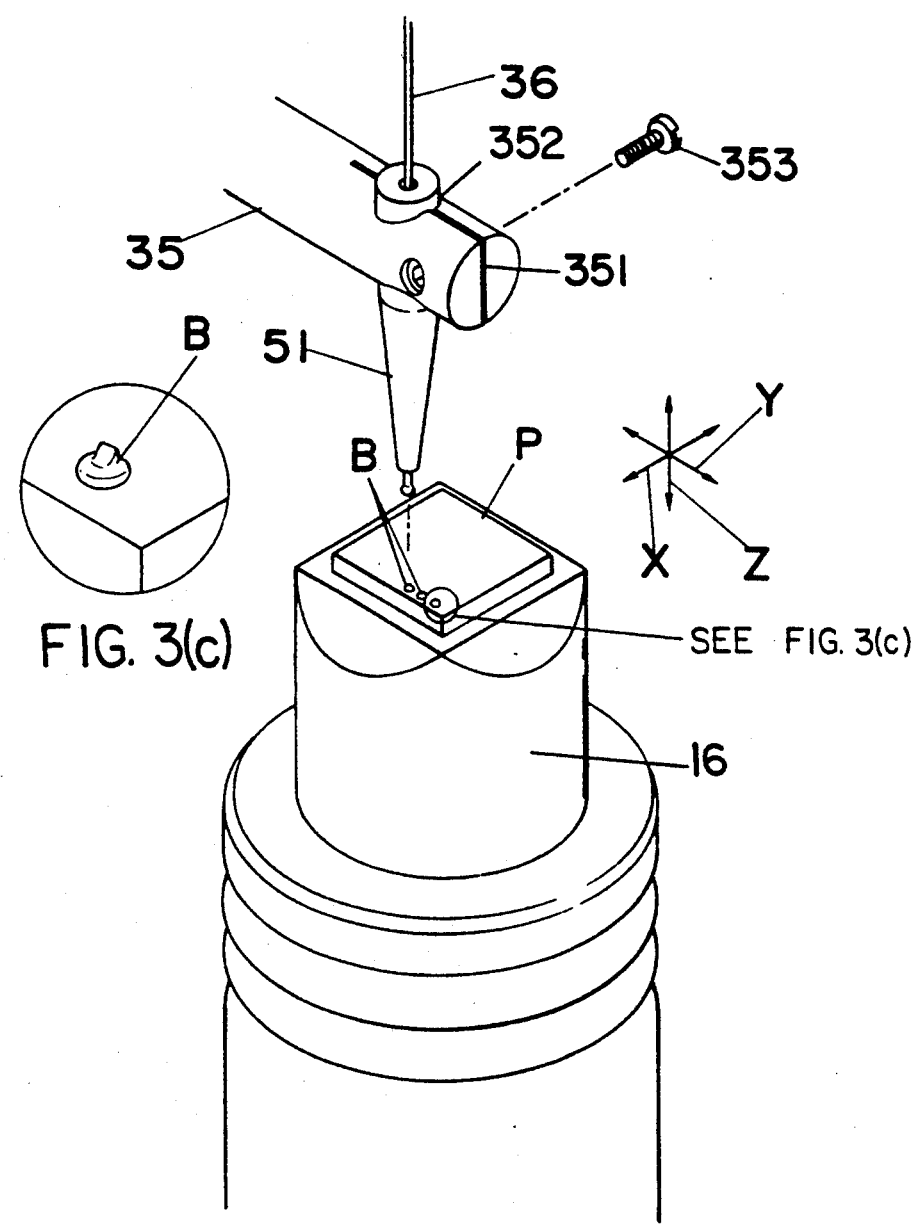
FIG. 3(a) is a perspective view of an essential part of the apparatus in a process of forming the bumps.

Before the inner lead bonding is carried out, the bumps B are formed in the chip P. FIGS. 2 and 3 show the forming process of the bumps B As shown in FIG. 2, the feeding reel 2 and the coiling reel 3 are taken out from the apparatus, and the film carrier is removed so that the horn 35 is used to hold the capillary tool 51.

Under this condition, the chip P on the tray 15 is shifted to the chip stage 16 by means of the pickup nozzle 23. Then, the chip P is moved just under the camera 22, and the positional deviation of the chip P in X, Y or θ directions is detected by the camera 22.

The X-Y table 11 is driven to move the chip P under the capillary tool 51. See FIG. 3(a). The positional deviation is then corrected by the means as described above. The X-Y table 31 is driven, and by moving the capillary tool 51 in X or Y directions, the bumps B are formed in the chip P. This process for forming the bumps is called a stud bump. As seen in the enlarged view of FIG. 3, the upper surfaces of the bumps B thus formed are irregular and not uniform in height.

Upon completion of the forming of the bumps B, the X-Y table 11 is driven to move the chip stage 16 toward the pickup nozzle 23, and the chip P on the chip stage 16 is picked up by the pickup nozzle 23 and is brought to the tray 15. By repeating the above operation, the bumps B are formed in all of the chips furnished in the tray 15.

Figure 3B:
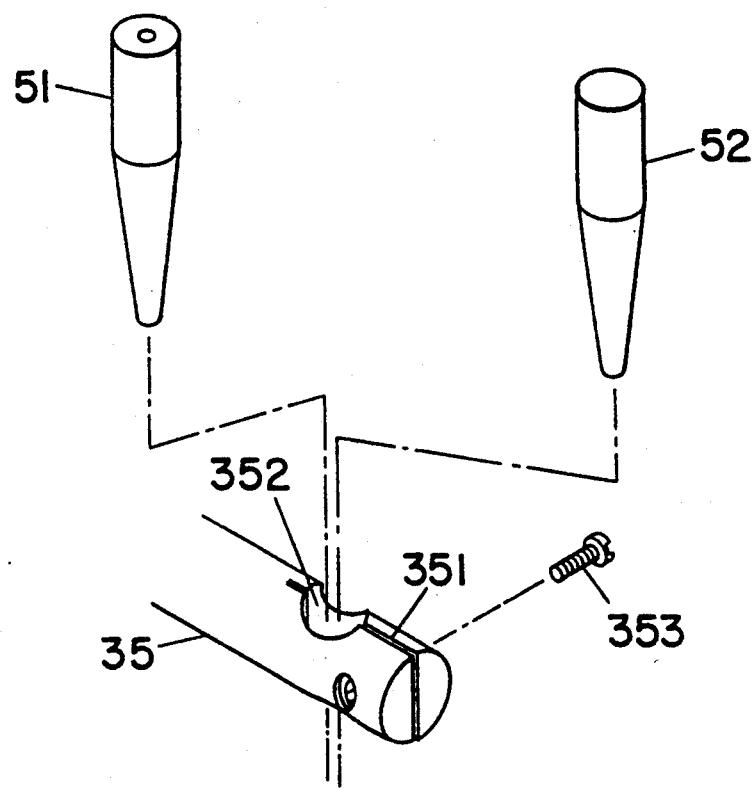
FIG. 3(b) is a perspective view to explain how a capillary tool or a pressing tool may be selectively fitted to the apparatus.

After the bumps B have been formed in the chip P, the inner lead bonding is performed in the same manner. FIG. 3(b) shows how an operator may manually replace capillary tool 51 in opening 352 in horn 35 by loosening and tightening of screw 352 which controls the opening of slit 351. FIGS. 5 and 10 show the inner lead bonding processes. In this case, as illustrated in FIG. 5, the pressing tool 52 is held by the horn 35 instead of the capillary tool 51. In addition, the feeding reel 2 and the coiling reel 3 are set, and the film carrier 4 is positioned under the adsorption plate 40.

As shown in FIG. 5, the X-Y table 11 is driven, and the desired chips P in the tray 15 are moved under the pickup nozzle 23 to pick up these chips P. Before the chips P are adsorbed to the pickup nozzle 23, these chips P are brought under the camera 22 for checking whether they are acceptable or not, and only acceptable ones are picked up by the pickup nozzle.

The X-Y table 11 is then driven to bring the chip stage 16 under the pickup nozzle 23, and the chip P adsorbed to the pickup nozzle 23 is mounted on the chip stage 16. (See FIG. 6.)

The chip P mounted on the chip stage 16 is brought under the camera 22 for detecting the positional deviation in X, Y or θ direction. This detection may be carried out by another camera 39.

The X-Y table 11 is driven to move the chip stage 16 under the pressing member 60 (See FIG. 4.) By actuating the cylinder 45, the chip stage 16 is moved upward and the bumps B are pressed on the pressing member 60 to align the upper surfaces and to align the height of the bumps B.

In the present embodiment, the chip stage 16 is moved in X or Y directions with respect to the pressing member 60, and the chip stage 16 is moved up and down to press the bumps B on the pressing member 60 in X or Y direction with respect to the chip stage 16 and to vertically move the pressing member 60, thereby pressing the bumps B on it. Further, a timing to form the bumps B is not limited to that of the present embodiment. After the bumps B have been formed by the capillary tool 51, the chip stage 16 may be brought under the pressing member 60 when the chip stage 16 is moved toward the tray 15. After the bumps B have been pressed by the pressing member 60, the chips P may be brought to the tray 15.

As illustrated in FIGS. 7 and 8, the chip stage 16 is moved just under the adsorption plate 40. In this case, the positional deviation of the chip P in X or Y direction is corrected by the means as described above. The cylinder 45 is actuated to move up the chip stage 16, and the bumps B of the chip P are connected to the leads L of the film carrier 4 (See FIG. 9.)

The film carrier 4 may also be moved down by moving down the sprockets 8 and 9 instead of moving up the chip stage 16 to connect the bumps B and the leads L.

As shown in FIG. 10, the X-Y table 31 is driven, and the leads L of the film carrier 4 are pressed against the bumps B by the pressing member 52 while moving the pressing member 52 in X or Y directions, and the leads L are bonded to the bumps B. In this case, all of the leads L can be preferably bonded to the bumps B because the upper surfaces of the bumps B are adjusted to flat and the heights of the bumps are aligned.

Upon completion of the inner lead bondings as described above, the pitch feeding of the film carrier 4 is performed by the sprockets 8 and 9, and subsequent inner lead bondings are carried out. By repeating this procedure, the inner lead bondings are achieved one after another.

As described above, it is possible according to the present invention to perform the working process for forming bumps on the chip and the working process of the inner lead bonding for bonding the leads of the film carrier to the bumps in the same apparatus by replacing the capillary tool and the pressing tool. Also, it is possible to bond the bumps satisfactorily on the leads by adjusting the upper surfaces of the bumps to flat and aligning the heights of the bumps.

What is claimed is:

1. An inner lead bonding apparatus, comprising:
    a feeding reel, having a film carrier wound thereon:
    a coiling reel for coiling the film carrier, said film carrier having leads thereon:
    pitch feeding means for pitch-feeding the film carrier;
    a horn driven by a first X-Y table to move above the film carrier in the X-Y directions;
    a capillary tool replaceably and selectively mounted to the horn;
    wire feeding means for feeding a wire to the capillary tool; a pressing tool replaceably and selectively mounted to the horn;
    a chip feeding unit;
    a pickup head for mounting chips furnished on the chip feeding unit to a chip stage; and
    a moving table for moving the chip stage; whereby said capillary tool forms bumps on said chips, and subsequently said pressing tool presses said film carrier leads to said bumps thereby bonding the chip to the film carrier.

2. An inner lead bonding apparatus according to claim 1, further comprising:
    an adsorption plate, positioned under the pressing tool held by said horn, for fixing said film carrier by adsorbing the film carrier.

3. An inner lead bonding apparatus according to claim 1, wherein:
    a pressing member provided in a moving path of said chip stage for pressing bumps formed on an upper surface of the chip on said chip stage.

4. An inner lead bonding apparatus according to claim 1, wherein:
    said moving table comprises a second X-Y table for selectively moving said chip stage in the X or Y directions.

5. An inner lead bonding apparatus according to claim 4, wherein:
    said chip feeding unit comprises a tray, and said tray is placed on a support mounted on said second X-Y table.

6. An inner lead bonding apparatus according to claim 1, further comprising:
    a motor provided for rotating said chip stage about a vertical axis on said moving table.

* * * * *